(12) United States Patent
Cho et al.

(10) Patent No.: US 8,541,872 B2
(45) Date of Patent: Sep. 24, 2013

(54) INTEGRATED CIRCUIT PACKAGE SYSTEM WITH PACKAGE STACKING AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 304 days.

(21) Appl. No.: 12/791,867

(22) Filed: Jun. 2, 2010

(65) Prior Publication Data

US 2011/0298119 A1 Dec. 8, 2011

(51) Int. Cl.
*H01L 23/02* (2006.01)
*H01L 29/40* (2006.01)

(52) U.S. Cl.
USPC ........... 257/686; 257/685; 257/787; 257/777; 257/778; 257/779; 257/780; 438/109; 438/127

(58) Field of Classification Search
USPC .......... 257/686, E21.499, E25.013, 777–779, 257/685, 787; 438/109, 127, 613
See application file for complete search history.

(56) References Cited

U.S. PATENT DOCUMENTS

| | | | |
|---|---|---|---|
| 7,364,945 B2 | 4/2008 | Shim et al. | |
| 7,553,752 B2 | 6/2009 | Kuan et al. | |
| 2002/0066952 A1* | 6/2002 | Taniguchi et al. | 257/698 |
| 2006/0180914 A1* | 8/2006 | Ha et al. | 257/688 |
| 2007/0210433 A1* | 9/2007 | Subraya et al. | 257/686 |
| 2007/0216006 A1* | 9/2007 | Park et al. | 257/686 |
| 2009/0001540 A1 | 1/2009 | Yang et al. | |
| 2009/0236718 A1 | 9/2009 | Yang et al. | |
| 2010/0007002 A1 | 1/2010 | Pendse | |
| 2010/0148344 A1* | 6/2010 | Chandra et al. | 257/690 |

* cited by examiner

*Primary Examiner* — Asok K Sarkar
*Assistant Examiner* — Dmitriy Yemelyanov
(74) *Attorney, Agent, or Firm* — Ishimaru & Associates LLP

(57) ABSTRACT

A method of manufacture of an integrated circuit package system includes: forming a non-inverted internal stacking module including: fabricating an internal stacking module (ISM) substrate having an ISM component side and an ISM coupling side, coupling an internal stacking module integrated circuit to the ISM component side, coupling stacking structures, adjacent to the internal stacking module integrated circuit, on the ISM component side, and molding a stacking module body having a top surface that is coplanar with and exposes the stacking structures; forming a base package substrate under the non-inverted internal stacking module; coupling middle structures between the base package substrate and the ISM coupling side; and forming a base package body on the base package substrate, the middle structures, and the non-inverted internal stacking module including exposing the top surface of the stacking module body to be coplanar with the base package body.

20 Claims, 6 Drawing Sheets

INTEGRATED CIRCUIT PACKAGE SYSTEM WITH PACKAGE STACKING AND METHOD OF MANUFACTURE THEREOF

TECHNICAL FIELD

The present invention relates generally to integrated circuit packaging, and more particularly to a system for multi-chip integrated circuit package stacking.

BACKGROUND ART

Every new generation of integrated circuit having increased operating frequency, performance and the higher level of integration has underscored the need for the integrated circuit packaging to meet the high speed signaling requirements of the new integrated circuits. Modern consumer electronics, such as smart phones, personal digital assistants, and location based services devices, as well as enterprise electronics, such as servers and storage arrays, are packing more integrated circuits into an ever-shrinking physical space with expectations for decreasing cost. Contemporary consumer electronics expose integrated circuits and packages to more demanding and sometimes new environmental conditions, such as cold, heat, and humidity requiring integrated circuit packages to provide robust thermal management structures.

As more functions are packed into the integrated circuits and more integrated circuits into the package, the packaged integrated circuits must reliably provide the high performance across specified environmental conditions. The integrated circuits support a portion of the performance assurance over various conditions. The integrated circuit package also supports a portion of the performance assurance and in some case more than the integrated circuits.

Numerous technologies have been developed to meet these requirements. Some of the research and development strategies focus on new package technologies while others focus on improving the existing and mature package technologies. Research and development in the existing package technologies may take a number of different directions.

One proven way to reduce cost is to use package technologies with existing manufacturing methods and equipment. Paradoxically, the reuse of existing manufacturing processes does not typically result in the reduction of package dimensions. Existing packaging technologies struggle to cost effectively meet the ever-increasing demands of today's integrated circuits and packages.

In response to the demands for improved packaging, many innovative package designs have been brought to market. The multi-chip package has achieved a prominent role in reducing the board space. Many package approaches stack multiple integrated circuits, package level stacking, or package-on-package (POP) stacking just to name a few. In these processes known-good-die (KGD) and assembly process yields are not an issue since each package can be tested prior to assembly. But stacking integrated devices, package-on-package, or a combination thereof present system level difficulties, such as increased package height and poor thermal dissipation. Stacked package combinations composed of two ordinary packages or package structures may not be optimal for high performance integrated circuits.

Thus, a need still remains for an integrated circuit package system with package stacking In view of the demand for increased function in limited space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: forming a non-inverted internal stacking module including: fabricating an internal stacking module (ISM) substrate having an ISM component side and an ISM coupling side, coupling an internal stacking module integrated circuit to the ISM component side, coupling stacking structures, adjacent to the internal stacking module integrated circuit, on the ISM component side, and molding a stacking module body having a top surface that is coplanar with and exposes the stacking structures; forming a base package substrate under the non-inverted internal stacking module; coupling middle structures between the base package substrate and the ISM coupling side; and forming a base package body on the base package substrate, the middle structures, and the non-inverted internal stacking module including exposing the top surface of the stacking module body to be coplanar with the base package body.

The present invention provides an integrated circuit package system, including: a non-inverted internal stacking module including: an internal stacking module (ISM) substrate having an ISM component side and an ISM coupling side, an internal stacking module integrated circuit coupled to the ISM component side, stacking structures, adjacent to the internal stacking module integrated circuit, coupled on the ISM component side, and a stacking module body having a top surface that is coplanar with and exposes the stacking structures; a base package substrate under the non-inverted internal stacking module; middle structures coupled between the base package substrate and the ISM coupling side; and a base package body molded on the base package substrate, the middle structures, and the non-inverted internal stacking module includes the top surface of the stacking module body is coplanar with the base package body.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
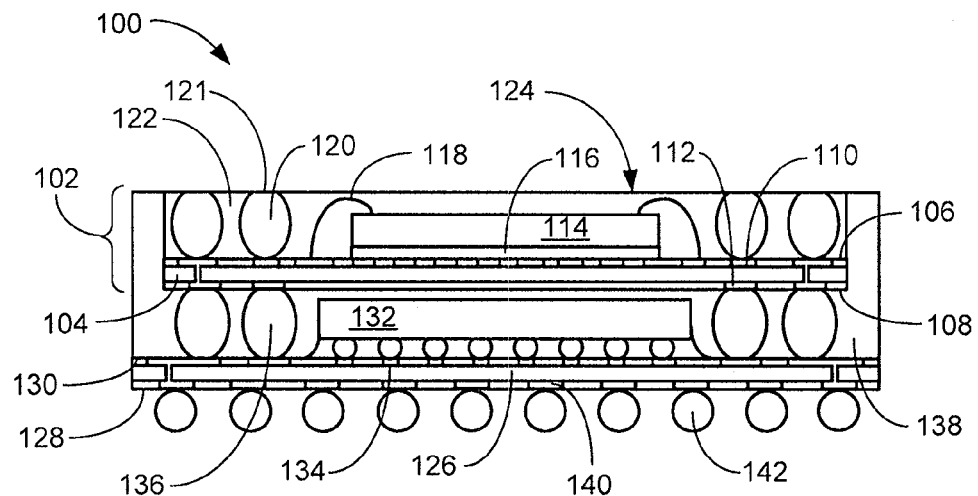
FIG. 1 is a cross-sectional view of an integrated circuit package system with package stacking in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the base integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between the elements with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 with package stacking in a first embodiment of the present invention. The cross-sectional view of the integrated circuit package system 100 depicts a non-inverted internal stacking module 102 having an ISM substrate 104 with an ISM component side 106 and an ISM coupling side 108.

The ISM substrate 104 may have connection pads 110 on the ISM component side 106 and coupling pads 112 on the ISM coupling side 108. The connection pads 110 may be coupled to the coupling pads 112 by internal circuitry, such as vias and traces, as is known in the art.

An ISM integrated circuit 114, such as a wire bond type or a flip chip type of integrated circuit, may be mounted on the ISM component side 106 by an adhesive 116. The adhesive 116 may be a die attach adhesive or an underfill adhesive which would be determined by the type of the ISM integrated circuit 114. Electrical interconnects 118, such as bond wires or solder balls, may couple the ISM integrated circuit 114 to the connection pads 110 on the ISM component side 106.

Stacking structures 120, such as solder balls, solder columns, or stud bumps, may be coupled to the connection pads 110, adjacent to the ISM integrated circuit 114, on the ISM component side 106. A stacking module body 122 may be formed, of an epoxy molding compound, to encapsulate the ISM integrated circuit 114, the electrical interconnects 118, the stacking structures 120, and the ISM component side 106.

The top of the stacking structures 120 may be flattened to be coplanar with the stacking module body 122 during the molding process that forms the stacking module body 122. A top surface 124 of the non-inverted internal stacking module 102 may have the stacking structures 120 exposed from and in the same plane as the top surface 124.

A base package substrate 126, such as a laminate substrate, a ceramic substrate, or a film substrate, may have a system side 128 and a stacking side 130. The base package substrate 126 is larger than the internal stacking module substrate 104 in horizontal dimensions. A base integrated circuit die 132 may be mounted on the stacking side 130 and coupled to component contacts 134 by the electrical interconnects 118. The adhesive 116 may be applied between the base package substrate 126 and the base integrated circuit die 132.

Middle structures 136, such as conductive columns, conductive pillars, or conductive balls, may be mounted on the component contacts 134 for forming an electrical connection and support structure between the base package substrate 126 and the coupling pads 112 on the ISM coupling side 108. The middle structures 136 may provide a space between the top of the base integrated circuit die 132 and the ISM coupling side 108 of the ISM substrate 104.

It has been discovered that the middle structures 136 may control the thickness of the integrated circuit package system 100 by determining the spacing between the non-inverted internal stacking module 102 and the base package substrate 126.

A base package body 138 may be formed of the epoxy molding compound to encapsulate the stacking side 130, the base integrated circuit die 132, the middle structures 136, the adhesive 116, the ISM coupling side 108, the stacking module body 122, and the non-inverted internal stacking module 102.

The base package body 138 may be formed to be coplanar with and exposing the top surface 124 of the stacking module body 122 and the top stacking surface 121 of the stacking structures 120.

The component contacts 134, on the stacking side 130, may be electrically connected to system pads 140, on the system side 128, by internal circuitry, such as vias and traces, as is known in the art. System interconnects 142 may be coupled to the system pads 140 for coupling the next level system (not shown). The System interconnects 142 may be electrically connected to the base integrated circuit die 132, the ISM integrated circuit 114, the stacking structures 120, exposed from the top surface 124, or a combination thereof.

It is understood that the number and position of the system interconnects 142, the middle structures 136 and the stacking structures 120 is an example only and their number and position may differ. It is also understood that there may be a difference between the total number of the middle structures 136 and the stacking structures 120. The non-inverted internal stacking module 102 is defined to be non-inverted because the ISM integrated circuit 114 is mounted above the ISM substrate 104.

Figure 2:
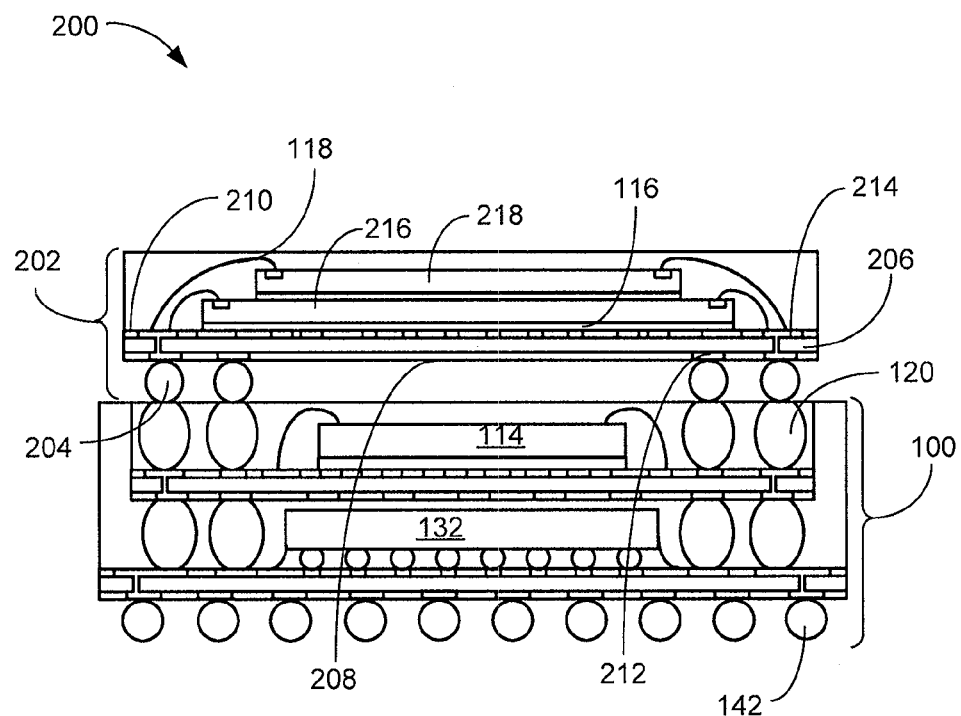
FIG. 2 is a cross-sectional view of a first package-on-package stack using the first embodiment of the present invention.

Referring now to FIG. 2, therein is shown a cross-sectional view of a first package-on-package stack 200 using the first embodiment of the present invention. The cross-sectional view of the first package-on-package stack 200 depicts the integrated circuit package system 100 having a stacked integrated circuit package 202 electrically connected to the stacking structures 120 by chip interconnects 204, such as solder balls, solder bumps, solder columns, or stud bumps.

A stacked package substrate 206 may have a base side 208 and a top side 210. The chip interconnects 204 may be mounted on a base pad 212 and be electrically connected to a top pad 214 through internal circuitry, such as vias and traces, as known in the industry.

A first stacked integrated circuit die 216 may be mounted on the top side 210 by the adhesive 116 and be electrically connected to the top pad 214 by the electrical interconnects 118. A second stacked integrated circuit die 218 may be mounted over the first stacked integrated circuit die 216 by the adhesive 116. The electrical interconnects 118 may couple the second stacked integrated circuit die 218 to the top pad 214 for forming an electrical connection to the first stacked integrated circuit die 216, the ISM integrated circuit 114, the base integrated circuit die 132, the system interconnects 142, or a combination thereof.

Figure 3:
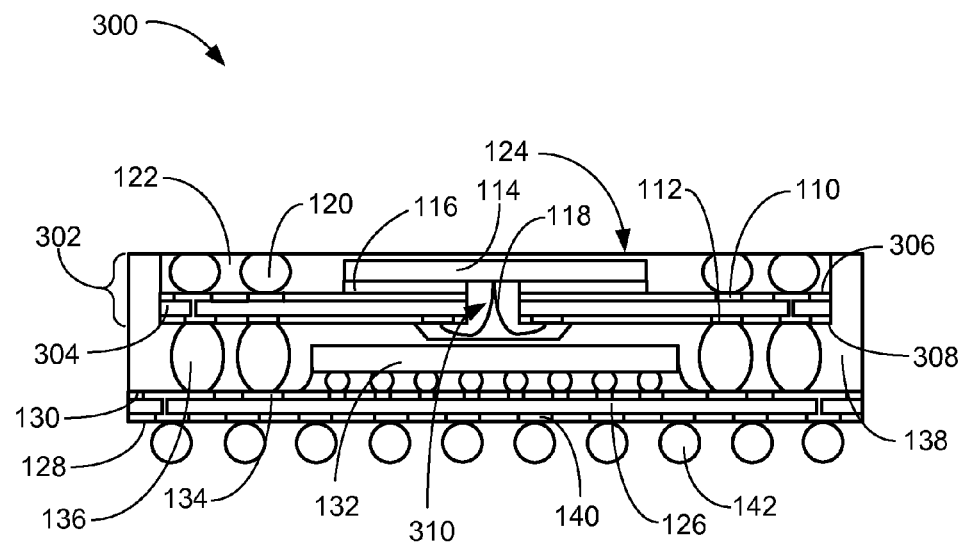
FIG. 3 is a cross-sectional view of an integrated circuit package system with package stacking in a second embodiment of the present invention.

Referring now to FIG. 3, therein is shown a cross-sectional view of an integrated circuit package system 300 with package stacking in a second embodiment of the present invention. The cross-sectional view of the integrated circuit package system 300 depicts a non-inverted internal stacking module 302 having an ISM substrate 304 with an ISM component side 306 and an ISM coupling side 308. An opening 310 may be centrally located in the ISM substrate 304.

The ISM substrate 304 may have the connection pads 110 on the ISM component side 306 and the coupling pads 112 on the ISM coupling side 308. The connection pads 110 may be coupled to the coupling pads 112 by internal circuitry, such as vias and traces, as is known in the art.

The ISM integrated circuit 114, such as a wire bond type or a flip chip type of integrated circuit, may be mounted on the ISM component side 306 by the adhesive 116. The adhesive 116 may be a die attach adhesive or an underfill adhesive which would be determined by the type of the ISM integrated circuit 114. The electrical interconnects 118, such as bond wires or solder balls, may couple the ISM integrated circuit 114 to the coupling pads 112 on the ISM coupling side 308. The electrical interconnects 118 may be routed through the opening 310.

The stacking structures 120, such as solder balls, solder columns, or stud bumps, may be coupled to the connection pads 110 on the ISM component side 306. The stacking module body 122 may be formed, of an epoxy molding compound, to encapsulate the ISM integrated circuit 114, the electrical interconnects 118, the stacking structures 120, and the ISM component side 306. The stacking module body 122 may include a lower portion that encapsulates the electrical interconnects 118 and the opening 310.

The top of the stacking structures 120 may be flattened to be coplanar with the stacking module body 122 during the molding process the forms the stacking module body 122. The top surface 124 of the non-inverted internal stacking module 302 may have the stacking structures 120 exposed from and in the same plane as the top surface 124.

The base package substrate 126, such as a laminate substrate, a ceramic substrate, or a film substrate, may have the system side 128 and the stacking side 130. The base integrated circuit die 132 may be mounted on the stacking side 130 and coupled to the component contacts 134 by the electrical interconnects 118. The adhesive 116 may be applied between the base package substrate 126 and the base integrated circuit die 132.

The middle structures 136 may be mounted on the component contacts 134 for forming an electrical connection and support structure between the base package substrate 126 and the coupling pads 112 on the ISM coupling side 308. The middle structures 136 may provide a space between the top of the base integrated circuit die 132 and the ISM coupling side 308 of the ISM substrate 104.

It has been discovered that the middle structures 136 may control the thickness of the integrated circuit package system 300 by determining the spacing between the non-inverted internal stacking module 302 and the base package substrate 126.

The base package body 138 may be formed of the epoxy molding compound to encapsulate the stacking side 130, the base integrated circuit die 132, the middle structures 136, the adhesive 116, and the non-inverted internal stacking module 302. The base package body 138 may be formed to be even with and exposing the top surface 124.

The component contacts 134, on the stacking side 130, may be electrically connected to the system pads 140, on the system side 128, by internal circuitry, such as vias and traces, as is known in the art. The system interconnects 142 may be coupled to the system pads 140 for coupling the next level system (not shown). The System interconnects 142 may be electrically connected to the base integrated circuit die 132, the ISM integrated circuit 114, the stacking structures 120, exposed from the top surface 124, or a combination thereof.

It is understood that the number and position of the system interconnects 142, the middle structures 136 and the stacking structures 120 is an example only and their number and position may differ. It is also understood that there may be a difference between the total number of the middle structures 136 and the stacking structures 120.

Figure 4:
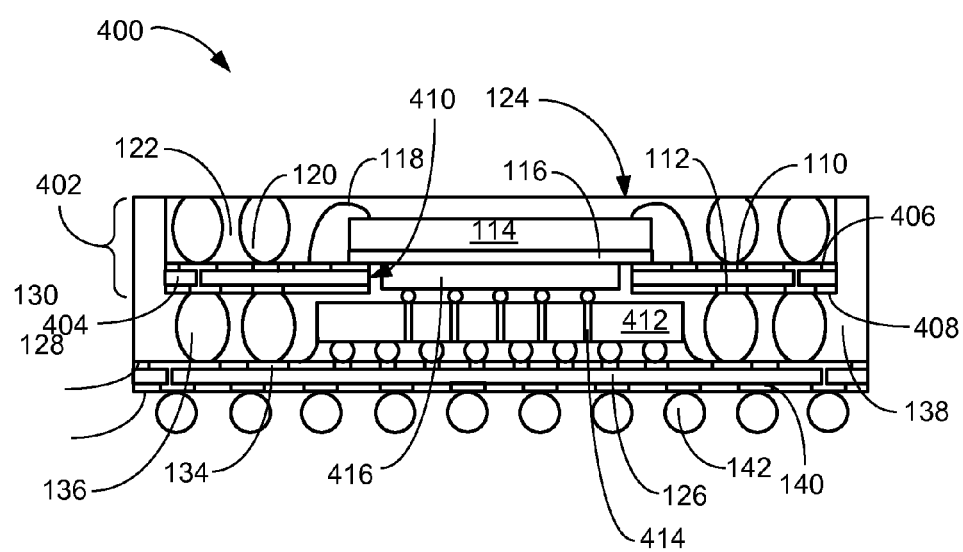
FIG. 4 is a cross-sectional view of an integrated circuit package system with package stacking in a third embodiment of the present invention.

Referring now to FIG. 4, therein is shown a cross-sectional view of an integrated circuit package system 400 with package stacking in a third embodiment of the present invention. The cross-sectional view of the integrated circuit package system 400 depicts a non-inverted internal stacking module 402 having an ISM substrate 404 with an ISM component side 406 and an ISM coupling side 408. An opening 410 may be centrally located in the ISM substrate 404.

The ISM substrate 404 may have the connection pads 110 on the ISM component side 406 and the coupling pads 112 on the ISM coupling side 408. The connection pads 110 may be coupled to the coupling pads 112 by internal circuitry, such as vias and traces, as is known in the art.

The ISM integrated circuit 114, such as a wire bond type or a flip chip type of integrated circuit, may be mounted on the ISM component side 406 by the adhesive 116. The adhesive 116 may be a die attach adhesive or an underfill adhesive which would be determined by the type of the ISM integrated circuit 114. The electrical interconnects 118, such as bond wires or solder balls, may couple the ISM integrated circuit 114 to the connection pads 110 on the ISM component side 406.

The stacking structures 120, such as solder balls, solder columns, or stud bumps, may be coupled to the connection pads 110 on the ISM component side 406. The stacking module body 122 may be formed, of an epoxy molding compound, to encapsulate the ISM integrated circuit 114, the electrical interconnects 118, the stacking structures 120, and the ISM component side 306. The stacking module body 122 does not include a lower portion in order to leave the opening 410 accessible from underneath.

The top of the stacking structures 120 may be flattened to be coplanar with the stacking module body 122 during the molding process the forms the stacking module body 122. The top surface 124 of the non-inverted internal stacking module 402 may have the stacking structures 120 exposed from and in the same plane as the top surface 124.

The base package substrate 126, such as a laminate substrate, a ceramic substrate, or a film substrate, may have the system side 128 and the stacking side 130. A base integrated circuit die 412, such as a through silicon via die, may be mounted on the stacking side 130 and coupled to the component contacts 134 by the electrical interconnects 118. The adhesive 116 may be applied between the base package substrate 126 and the base integrated circuit die 412. Through silicon vias 414 may allow electrical connections between an active side and a back side of the base integrated circuit die 412.

A second base integrated circuit die 416 may be mounted above the base integrated circuit die 412. The active side of the second base integrated circuit die 416 may be coupled to the through silicon vias 414 by the electrical interconnects 118, such as solder balls.

The middle structures 136 may be mounted on the component contacts 134 for forming an electrical connection and support structure between the base package substrate 126 and the coupling pads 112 on the ISM coupling side 408. The middle structures 136 may provide a space between the top of the second base integrated circuit die 416 and the adhesive 116 applied to the bottom of the ISM integrated circuit 114. The second base integrated circuit die 416 may protrude into the opening 410 or contact the adhesive 116.

It has been discovered that the middle structures 136 may control the thickness of the integrated circuit package system 400 by determining the spacing between the non-inverted internal stacking module 402 and the base package substrate 126.

The base package body 138 may be formed of the epoxy molding compound to encapsulate the stacking side 130, the base integrated circuit die 412, the middle structures 136, the adhesive 116, and the non-inverted internal stacking module 402. The base package body 138 may be formed to be even with and exposing the top surface 124.

The component contacts 134, on the stacking side 130, may be electrically connected to the system pads 140, on the system side 128, by internal circuitry, such as vias and traces, as is known in the art. The system interconnects 142 may be coupled to the system pads 140 for coupling the next level system (not shown). The System interconnects 142 may be electrically connected to the base integrated circuit die 412, the second base integrated circuit 416, the ISM integrated circuit 114, the stacking structures 120, exposed from the top surface 124, or a combination thereof.

It is understood that the number and position of the system interconnects 142, the middle structures 136 and the stacking structures 120 is an example only and their number and position may differ. It is also understood that there may be a difference between the total number of the middle structures 136 and the stacking structures 120.

Figure 5:
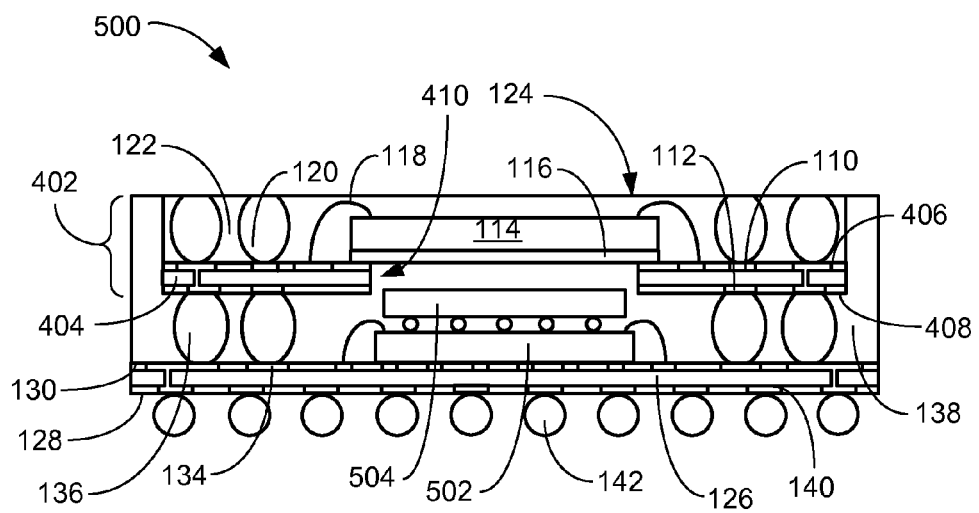
FIG. 5 is a cross-sectional view of an integrated circuit package system with package stacking in a fourth embodiment of the present invention.

Referring now to FIG. 5, therein is shown a cross-sectional view of an integrated circuit package system 500 with package stacking in a fourth embodiment of the present invention. The cross-sectional view of the integrated circuit package system 500 depicts the non-inverted internal stacking module 402 having the ISM substrate 404 with the ISM component side 406 and the ISM coupling side 408. The opening 410 may be centrally located in the ISM substrate 404.

The ISM substrate 404 may have the connection pads 110 on the ISM component side 406 and the coupling pads 112 on the ISM coupling side 408. The connection pads 110 may be coupled to the coupling pads 112 by internal circuitry, such as vias and traces, as is known in the art.

The ISM integrated circuit 114, such as a wire bond type or a flip chip type of integrated circuit, may be mounted on the ISM component side 406 by the adhesive 116. The adhesive 116 may be a die attach adhesive or an underfill adhesive which would be determined by the type of the ISM integrated circuit 114. The electrical interconnects 118, such as bond wires or solder balls, may couple the ISM integrated circuit 114 to the connection pads 110 on the ISM component side 406.

The stacking structures 120, such as solder balls, solder columns, or stud bumps, may be coupled to the connection pads 110 on the ISM component side 406. The stacking module body 122 may be formed, of an epoxy molding compound, to encapsulate the ISM integrated circuit 114, the electrical interconnects 118, the stacking structures 120, and the ISM component side 306. The stacking module body 122 does not include a lower portion in order to leave the opening 410 accessible from underneath.

The top of the stacking structures 120 may be flattened to be coplanar with the stacking module body 122 during the molding process the forms the stacking module body 122. The top surface 124 of the non-inverted internal stacking module 402 may have the stacking structures 120 exposed from and in the same plane as the top surface 124.

The base package substrate 126, such as a laminate substrate, a ceramic substrate, or a film substrate, may have the system side 128 and the stacking side 130. A base integrated circuit die 502, such as a wire bond die, may be mounted on the stacking side 130 and coupled to the component contacts 134 by the electrical interconnects 118. The adhesive 116 may be applied between the base package substrate 126 and the base integrated circuit die 502.

A second base integrated circuit die 504 may be mounted above the base integrated circuit die 502. The active side of the second base integrated circuit die 504 may be coupled to the active side of the base integrated circuit die 502 by the electrical interconnects 118, such as solder balls.

The middle structures 136 may be mounted on the component contacts 134 for forming an electrical connection and support structure between the base package substrate 126 and the coupling pads 112 on the ISM coupling side 408. The middle structures 136 may provide a space between the top of the second base integrated circuit die 504 and the adhesive 116 applied to the bottom of the ISM integrated circuit 114. The second base integrated circuit die 504 may protrude into the opening 410 or contact the adhesive 116.

It has been discovered that the middle structures 136 may control the thickness of the integrated circuit package system 500 by determining the spacing between the non-inverted internal stacking module 402 and the base package substrate 126.

The base package body 138 may be formed of the epoxy molding compound to encapsulate the stacking side 130, the base integrated circuit die 502, the middle structures 136, the adhesive 116, and the non-inverted internal stacking module 402. The base package body 138 may be formed to be even with and exposing the top surface 124.

The component contacts 134, on the stacking side 130, may be electrically connected to the system pads 140, on the system side 128, by internal circuitry, such as vias and traces, as is known in the art. The system interconnects 142 may be coupled to the system pads 140 for coupling the next level system (not shown). The System interconnects 142 may be electrically connected to the base integrated circuit die 502, the second base integrated circuit 504, the ISM integrated circuit 114, the stacking structures 120, exposed from the top surface 124, or a combination thereof.

It is understood that the number and position of the system interconnects 142, the middle structures 136 and the stacking structures 120 is an example only and their number and position may differ. It is also understood that there may be a difference between the total number of the middle structures 136 and the stacking structures 120.

Figure 6:
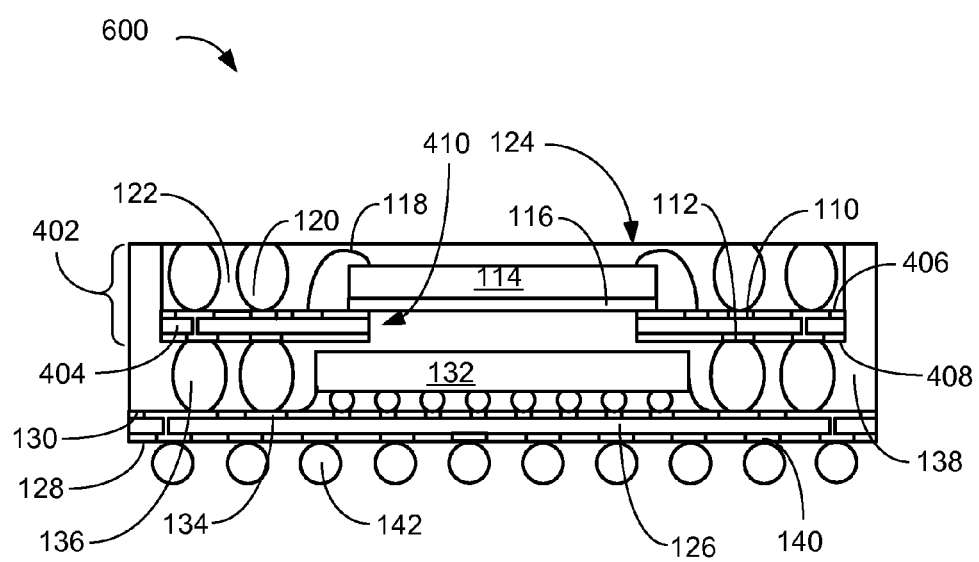
FIG. 6 is a cross-sectional view of an integrated circuit package system with package stacking in a fifth embodiment of the present invention.

Referring now to FIG. 6, therein is shown a cross-sectional view of an integrated circuit package system 600 with package stacking in a fifth embodiment of the present invention. The cross-sectional view of the integrated circuit package system 600 depicts the non-inverted internal stacking module 402 having the ISM substrate 404 with the ISM component side 406 and the ISM coupling side 408. The opening 410 may be centrally located in the ISM substrate 404.

The ISM substrate 404 may have the connection pads 110 on the ISM component side 406 and the coupling pads 112 on the ISM coupling side 408. The connection pads 110 may be coupled to the coupling pads 112 by internal circuitry, such as vias and traces, as is known in the art.

The ISM integrated circuit 114, such as a wire bond type or a flip chip type of integrated circuit, may be mounted on the ISM component side 406 by the adhesive 116. The adhesive 116 may be a die attach adhesive or an underfill adhesive which would be determined by the type of the ISM integrated circuit 114. The electrical interconnects 118, such as bond wires or solder balls, may couple the ISM integrated circuit 114 to the connection pads 110 on the ISM component side 406.

The stacking structures 120, such as solder balls, solder columns, or stud bumps, may be coupled to the connection pads 110 on the ISM component side 306. The stacking module body 122 may be formed, of an epoxy molding compound, to encapsulate the ISM integrated circuit 114, the electrical interconnects 118, the stacking structures 120, and the ISM component side 406. The stacking module body 122 does not include a lower portion in order to leave the opening 410 accessible from underneath.

The top of the stacking structures 120 may be flattened to be coplanar with the stacking module body 122 during the molding process the forms the stacking module body 122.

The top surface 124 of the non-inverted internal stacking module 402 may have the stacking structures 120 exposed from and in the same plane as the top surface 124.

The base package substrate 126, such as a laminate substrate, a ceramic substrate, or a film substrate, may have the system side 128 and the stacking side 130. The base integrated circuit die 132, such as a wire bond die, may be mounted on the stacking side 130 and coupled to the component contacts 134 by the electrical interconnects 118. The adhesive 116 may be applied between the base package substrate 126 and the base integrated circuit die 132.

The middle structures 136 may be mounted on the component contacts 134 for forming an electrical connection and support structure between the base package substrate 126 and the coupling pads 112 on the ISM coupling side 108. The middle structures 136 may provide a space between the top of the base integrated circuit die 132 and the adhesive 116 applied to the bottom of the ISM integrated circuit 114.

It has been discovered that the middle structures 136 may control the thickness of the integrated circuit package system 600 by determining the spacing between the non-inverted internal stacking module 102 and the base package substrate 126.

The base package body 138 may be formed of the epoxy molding compound to encapsulate the stacking side 130, the base integrated circuit die 132, the middle structures 136, the adhesive 116, and the non-inverted internal stacking module 402. The base package body 138 may be formed to be even with and exposing the top surface 124.

The component contacts 134, on the stacking side 130, may be electrically connected to the system pads 140, on the system side 128, by internal circuitry, such as vias and traces, as is known in the art. The system interconnects 142 may be coupled to the system pads 140 for coupling the next level system (not shown). The System interconnects 142 may be electrically connected to the base integrated circuit die 132, the ISM integrated circuit 114, the stacking structures 120, exposed from the top surface 124, or a combination thereof.

It is understood that the number and position of the system interconnects 142, the middle structures 136 and the stacking structures 120 is an example only and their number and position may differ. It is also understood that there may be a difference between the total number of the middle structures 136 and the stacking structures 120.

Figure 7:
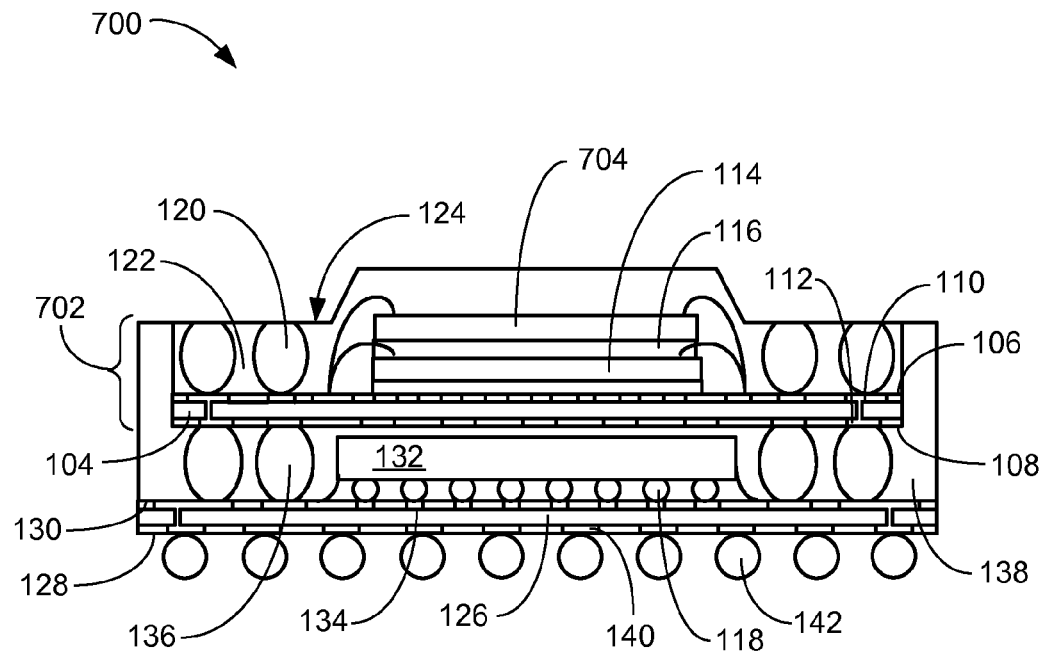
FIG. 7 is a cross-sectional view of an integrated circuit package system with package stacking in a sixth embodiment of the present invention.

Referring now to FIG. 7, therein is shown a cross-sectional view of an integrated circuit package system 700 with package stacking in a sixth embodiment of the present invention. The cross-sectional view of the integrated circuit package system 700 depicts a non-inverted internal stacking module 702 having the ISM substrate 104 with the ISM component side 106 and the ISM coupling side 108.

The ISM substrate 104 may have the connection pads 110 on the ISM component side 106 and the coupling pads 112 on the ISM coupling side 108. The connection pads 110 may be coupled to the coupling pads 112 by internal circuitry, such as vias and traces, as is known in the art.

The ISM integrated circuit 114, such as a wire bond type or a flip chip type of integrated circuit, may be mounted on the ISM component side 106 by the adhesive 116. The adhesive 116 may be a die attach adhesive or an underfill adhesive which would be determined by the type of the ISM integrated circuit 114. The electrical interconnects 118, such as bond wires or solder balls, may couple the ISM integrated circuit 114 to the connection pads 110 on the ISM component side 106. A second ISM integrated circuit 704 may be mounted above the ISM integrated circuit 114 by the adhesive 116 and coupled to the connection pads 110 by the electrical interconnects 118.

The stacking structures 120, such as solder balls, solder columns, or stud bumps, may be coupled to the connection pads 110 on the ISM component side 106. The stacking module body 122 may be formed, of an epoxy molding compound, to encapsulate the ISM integrated circuit 114, the electrical interconnects 118, the stacking structures 120, and the ISM component side 306. The stacking module body 122 does not include a lower portion in order to leave the opening 410 accessible from underneath.

The top of the stacking structures 120 may be flattened to be coplanar with the stacking module body 122 during the molding process that forms the stacking module body 122. The top surface 124 of the non-inverted internal stacking module 102 may have the stacking structures 120 exposed from and in the same plane as the top surface 124. A central region of the stacking module body 122 may protrude above the top surface 124, which completely surrounds the protrusion.

The base package substrate 126, such as a laminate substrate, a ceramic substrate, or a film substrate, may have the system side 128 and the stacking side 130. The base integrated circuit die 132, such as a wire bond die, may be mounted on the stacking side 130 and coupled to the component contacts 134 by the electrical interconnects 118. The adhesive 116 may be applied between the base package substrate 126 and the base integrated circuit die 132.

The middle structures 136 may be mounted on the component contacts 134 for forming an electrical connection and support structure between the base package substrate 126 and the coupling pads 112 on the ISM coupling side 108. The middle structures 136 may provide a space between the top of the base integrated circuit die 132 and the adhesive 116 applied to the bottom of the ISM integrated circuit 114.

It has been discovered that the middle structures 136 may control the thickness of the integrated circuit package system 700 by determining the spacing between the non-inverted internal stacking module 102 and the base package substrate 126.

The base package body 138 may be formed of the epoxy molding compound to encapsulate the stacking side 130, the base integrated circuit die 132, the middle structures 136, the adhesive 116, and the non-inverted internal stacking module 102. The base package body 138 may be formed to be even with and exposing the top surface 124.

The component contacts 134, on the stacking side 130, may be electrically connected to the system pads 140, on the system side 128, by internal circuitry, such as vias and traces, as is known in the art. The system interconnects 142 may be coupled to the system pads 140 for coupling the next level system (not shown). The System interconnects 142 may be electrically connected to the base integrated circuit die 132, the ISM integrated circuit 114, the second ISM integrated circuit 704, the stacking structures 120, exposed from the top surface 124, or a combination thereof.

It is understood that the number and position of the system interconnects 142, the middle structures 136 and the stacking structures 120 is an example only and their number and position may differ. It is also understood that there may be a difference between the total number of the middle structures 136 and the stacking structures 120.

Figure 8:
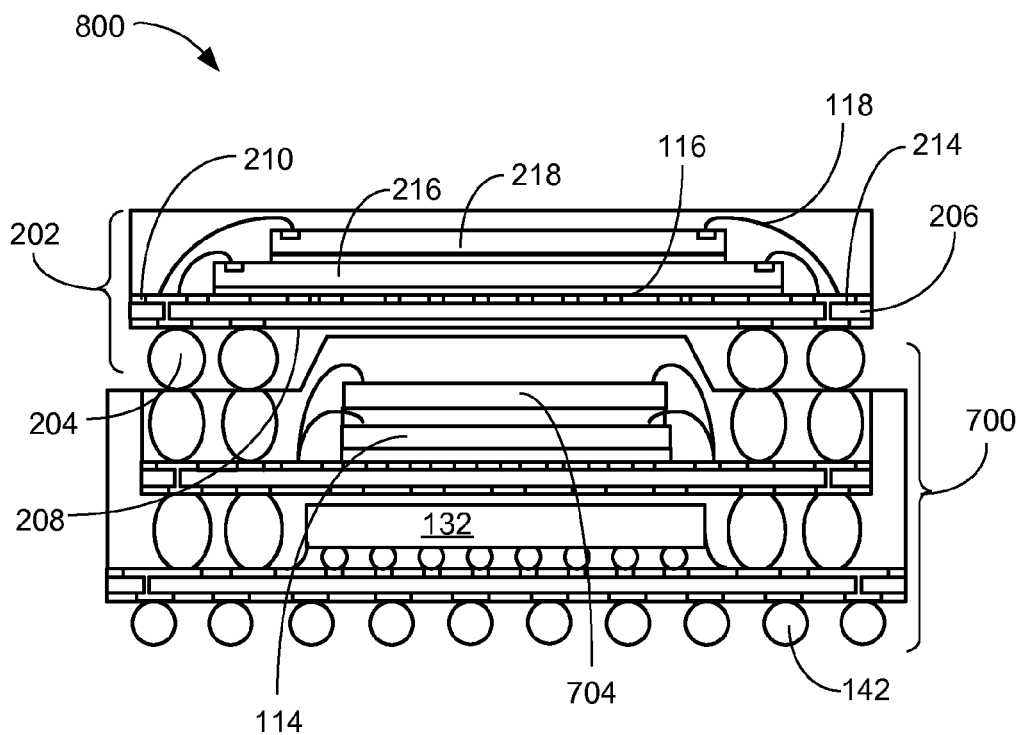
FIG. 8 is a cross-sectional view of a second package-on-package stack using the sixth embodiment of the present invention.

Referring now to FIG. 8, therein is shown a cross-sectional view of a second package-on-package stack 800 using the sixth embodiment of the present invention. The cross-sectional view of the second package-on-package stack 800 depicts the integrated circuit package system 700 having the stacked integrated circuit package 202 electrically connected to the stacking structures 120 by the chip interconnects 204, such as solder balls, solder bumps, solder columns, or stud bumps.

The stacked package substrate 206 may have the base side 208 and the top side 210. The chip interconnects 204 may be mounted on the base pad 212 and be electrically connected to the top pad 214 through internal circuitry, such as vias and traces, as known in the industry.

The first stacked integrated circuit die 216 may be mounted on the top side 210 by the adhesive 116 and be electrically connected to the top pad 214 by the electrical interconnects 118. The second stacked integrated circuit die 218 may be mounted over the first stacked integrated circuit die 216 by the adhesive 116. The electrical interconnects 118 may couple the second stacked integrated circuit die 218 to the top pad 214 for forming an electrical connection to the first stacked integrated circuit die 216, the ISM integrated circuit 114, the second ISM integrated circuit 704, the base integrated circuit die 132, the system interconnects 142, or a combination thereof.

It is understood that any of the embodiments of the integrated circuit package system 100 may be substituted for the integrated circuit package system 700. The selected combination may provide the balance of manufacturing yield and function density.

Figure 9:
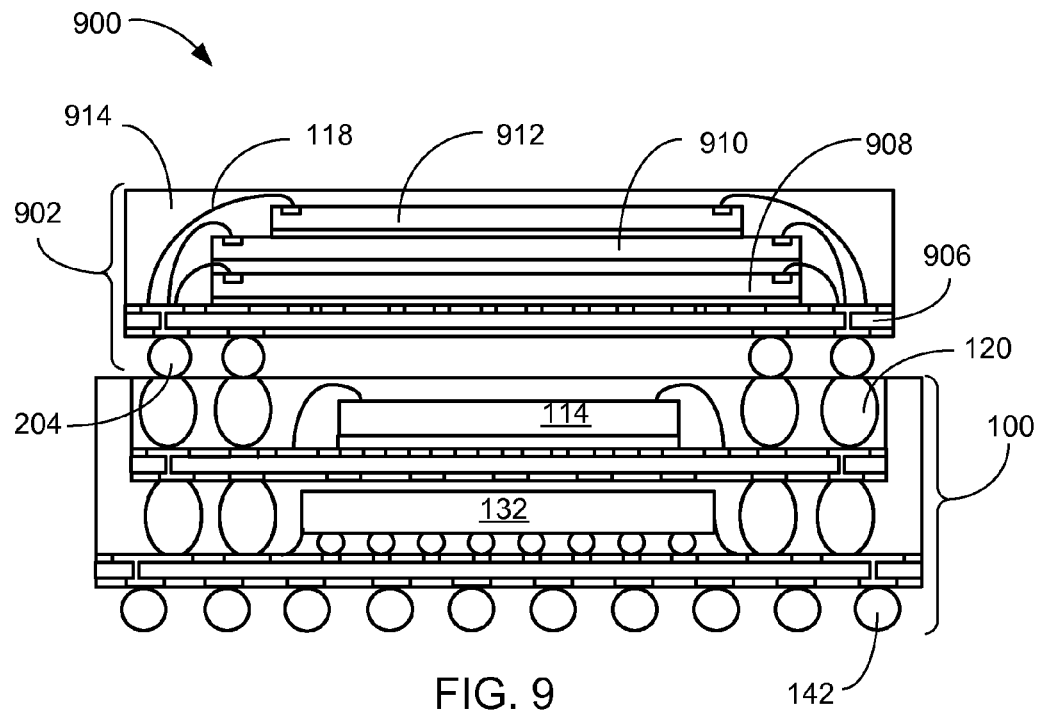
FIG. 9 is a cross-sectional view of a third package-on-package stack using the first embodiment of the present invention.

Referring now to FIG. 9, therein is shown a cross-sectional view of a third package-on-package stack 900 using the first embodiment of the present invention. The cross-sectional view of the third package-on-package stack 900 depicts the integrated circuit package system 100 having a multi-chip integrated circuit package 902 stacked and coupled to the stacking structures 120 by the chip interconnects 204.

The multi-chip integrated circuit package 902 includes a package substrate 906 with a first stacked integrated circuit die 908 mounted on the package substrate 906. The electrical interconnects 118, such as bond wires may couple the first stacked integrated circuit die 908 to the package substrate 906.

A second stacked integrated circuit die 910 may be mounted above the first stacked integrated circuit die 908. The second stacked integrated circuit die 910 is coupled to the package substrate 906 by the electrical interconnects 118.

A third stacked integrated circuit die 912 may be mounted over the second stacked integrated circuit die 910. The third stacked integrated circuit die 912 is coupled to the package substrate 906 by the electrical interconnects 118. A package body 914, such as an epoxy molding compound may be formed on the package substrate 906, the first stacked integrated circuit die 908, the electrical interconnects 118, the second stacked integrated circuit die 910, and the third stacked integrated circuit die 912.

The stacking of the multi-chip integrated circuit package 902 may provide and electrical connection between the base integrated circuit die 132, the ISM integrated circuit 114, the system interconnects 142, the first stacked integrated circuit die 908, the second stacked integrated circuit die 910, the third stacked integrated circuit die 912, or a combination thereof. The multi-chip integrated circuit package 902 having the first stacked integrated circuit die 908, the second stacked integrated circuit die 910, and the third stacked integrated circuit die 912 is an example only and any number of the integrated circuit dies may be included in the multi-chip integrated circuit package 902.

It is understood that the integrated circuit package system 100 was an example only and any of the embodiments of the present invention may be put in place thereof.

Figure 10:
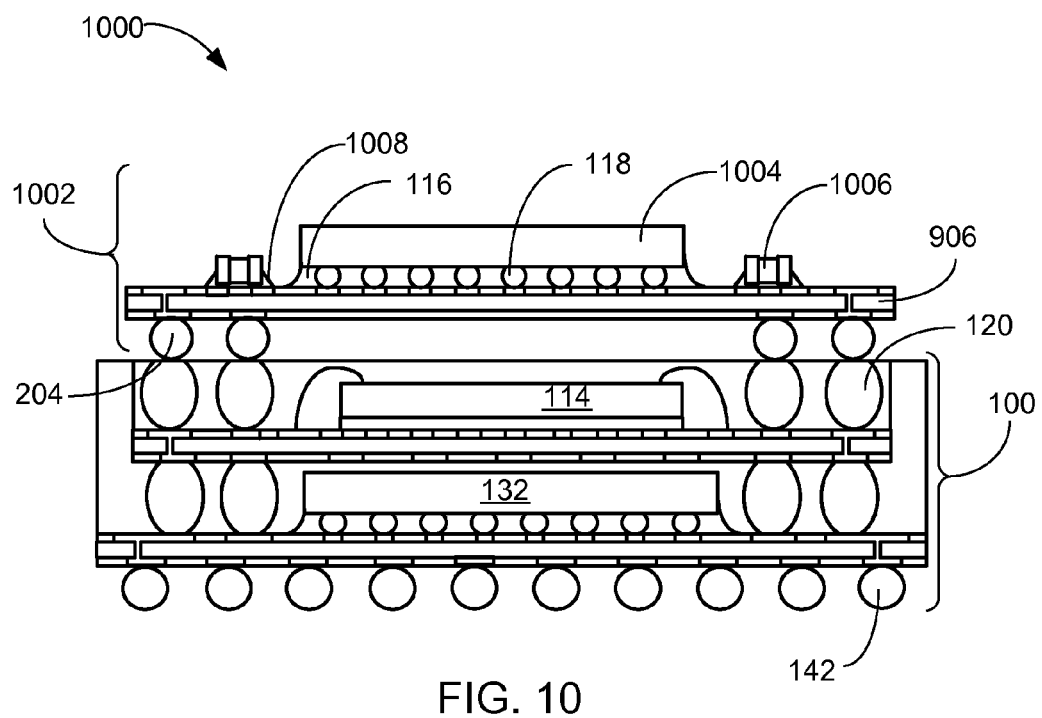
FIG. 10 is a cross-sectional view of a fourth package-on-package stack using the first embodiment of the present invention.

Referring now to FIG. 10, therein is shown a cross-sectional view of a fourth package-on-package stack 1000 using the first embodiment of the present invention. The cross-sectional view of the fourth package-on-package stack 1000 depicts the integrated circuit package system 100 having an integrated circuit carrier 1002 stacked and coupled to the stacking structures 120 by the chip interconnects 204.

The integrated circuit carrier 1002 includes the package substrate 906 with a first stacked flip chip die 1004 mounted on the package substrate 906. The electrical interconnects 118, such as solder bumps, may couple the first stacked flip chip die 1004 to the package substrate 906.

The first stacked flip chip die 1004 may have the adhesive 116, such as an underfill material, applied between the package substrate 906 and the active side of the first stacked flip chip die 1004. Discrete components 1006 may be coupled to the top side of the package substrate 906 by a conductive adhesive 1008, such as solder paste, for forming an electrical connection between the base integrated circuit die 132, the ISM integrated circuit 114, the system interconnects 142, the first stacked flip chip die 1004, the discrete components 1006, or a combination thereof.

It has been discovered that the inclusion of the discrete components 1006 on the integrated circuit carrier 1002 may provide precision analog circuitry that would not be economically feasible to fabricate in an integrated circuit. The combination of the multi-chip integration of the integrated circuit package system 100 and the integrated circuit carrier 1002 may provide an extremely flexible fabrication platform for combining high levels of integration and precision analog capabilities.

It is understood that the integrated circuit package system 100 was an example only and any of the embodiments of the present invention may be put in place thereof.

Figure 11:
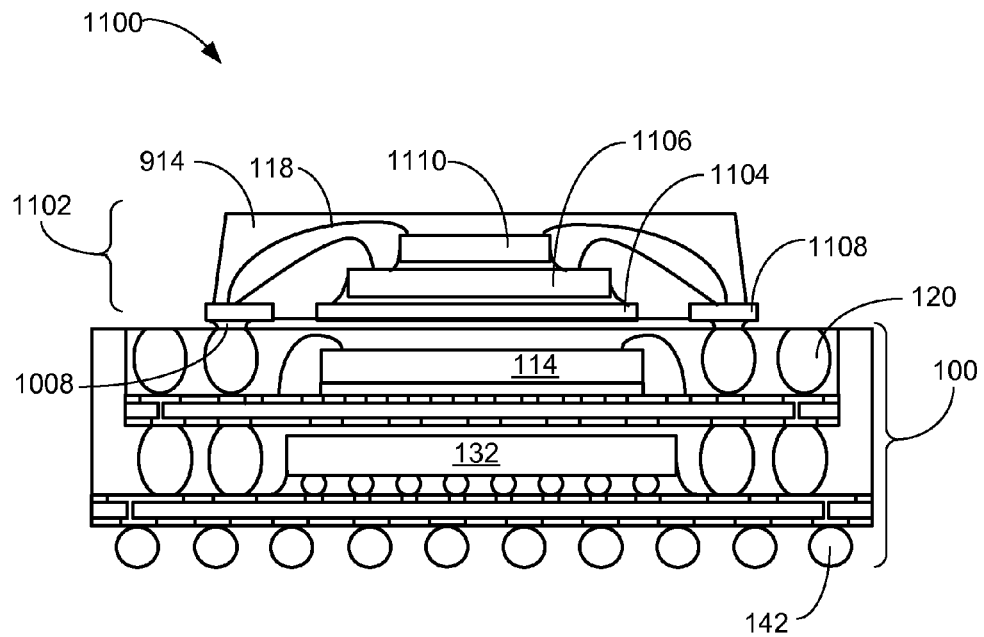
FIG. 11 is a cross-sectional view of a fifth package-on-package stack using the first embodiment of the present invention.

Referring now to FIG. 11, therein is shown a cross-sectional view of a fifth package-on-package stack 1100 using the first embodiment of the present invention. The cross-sectional view of the fifth package-on-package stack 1100 depicts the integrated circuit package system 100 having a Quad Flatpack No lead (QFN) package 1102 stacked and coupled to the stacking structure 120 by the conductive adhesive 1008.

The QFN package 1102 includes a die attach pad 1104 with a first stacked QFN die 1106 mounted on the die attach pad 1104. The electrical interconnects 118, such as bond wires, may couple the first stacked QFN die 1106 to an external lead 1108.

A second stacked QFN die 1110 may be mounted above the first stacked QFN die 1106. The second stacked QFN die 1110 is coupled to the external leads 1108 by the electrical interconnects 118. The package body 914, such as an epoxy molding compound may be formed on the die attach pad 1104, the first stacked QFN die 1106, the second stacked QFN die 1110, the electrical interconnects 118, and the external leads 1108.

The stacking of the QFN package 1102 may provide and electrical connection between the base integrated circuit die 132, the ISM integrated circuit 114, the system interconnects 142, the first stacked QFN die 1106, the second stacked QFN die 1110, or a combination thereof. The QFN package 1102 having the first stacked QFN die 1106 and the second stacked QFN die 1110 is an example only and any number of the integrated circuit dies may be included in the QFN package 1102.

It has been discovered that the QFN package 1102 may be mounted on any of the embodiments of the present invention, such as the integrated circuit package system 100, the integrated circuit package system 400, of FIG. 4, or the integrated circuit package system 500, of FIG. 5, etc. in order to provide a custom level of integration of both digital logic and precision analog circuitry. It has further been discovered that the embodiments of the present invention may be stacked upon a fan-in or fan-out base package for an enhanced package-on-package stack (not shown).

Figure 12:
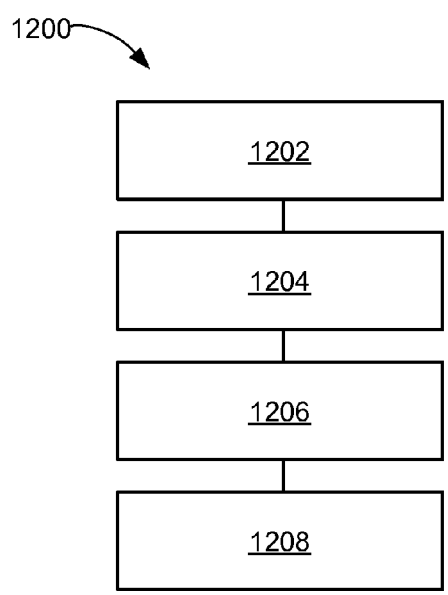
FIG. 12 is a flow chart of a method of manufacture of an integrated circuit package system in a further embodiment of the present invention.

Referring now to FIG. 12, therein is shown a flow chart of a method 1200 of manufacture of an integrated circuit package system in a further embodiment of the present invention. The method 1200 includes: forming a non-inverted internal stacking module including: fabricating an internal stacking module (ISM) substrate having an ISM component side and an ISM coupling side, coupling an internal stacking module integrated circuit to the ISM component side, coupling stacking structures, adjacent to the internal stacking module integrated circuit, on the ISM component side, and molding a stacking module body having a top surface that is coplanar with and exposes the stacking structures in a block 1202; forming a base package substrate under the non-inverted internal stacking module in a block 1204; coupling middle structures between the base package substrate and the ISM coupling side in a block 1206; and forming a base package body on the base package substrate, the middle structures, and the non-inverted internal stacking module including exposing the top surface of the stacking module body to be coplanar with the base package body in a block 1208.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit package systems with package stacking fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit package system comprising:
    forming a non-inverted internal stacking module including:
        fabricating an internal stacking module (ISM) substrate having an ISM component side and an ISM coupling side,
        coupling an internal stacking module integrated circuit to the ISM component side,
        coupling stacking structures, adjacent to the internal stacking module integrated circuit, on the ISM component side, and molding a stacking module body having a top surface that is coplanar with and exposes the stacking structures;

forming a base package substrate under the non-inverted internal stacking module;

coupling middle structures between the base package substrate and the ISM coupling side; and forming a base package body on the base package substrate, the middle structures, the ISM coupling side, the stacking module body, and the non-inverted internal stacking module, the base package body having a top surface coplanar with the top surface of the stacking module body and a top stacking surface of the stacking structures.

2. The method as claimed in claim 1 further comprising coupling a base integrated circuit die on the base package substrate surrounded by the middle structures.

3. The method as claimed in claim 1 wherein fabricating the internal stacking module substrate includes forming an opening in the internal stacking module substrate.

4. The method as claimed in claim 1 further comprising coupling a stacked integrated circuit package on the stacking structures.

5. The method as claimed in claim 1 further comprising coupling a second internal stacking module integrated circuit over the internal stacking module integrated circuit.

6. A method of manufacture of an integrated circuit package system comprising:

forming a non-inverted internal stacking module including:

fabricating an internal stacking module (ISM) substrate having an ISM component side and an ISM coupling side including forming connection pads on the ISM component side and coupling pads on the ISM coupling side, coupling an internal stacking module integrated circuit to the ISM component side including coupling electrical interconnects between the internal stacking module integrated circuit and the connection pads, coupling stacking structures, adjacent to the internal stacking module integrated circuit, on the ISM component side by the stacking structures coupled to the connection pads, and molding a stacking module body having a top surface that is coplanar with and exposes the stacking structures;

forming a base package substrate under the non-inverted internal stacking module including the base package substrate is larger than the non-inverted internal stacking module;

coupling middle structures between the base package substrate and the ISM coupling side including coupling conductive columns, conductive pillars, or conductive balls; and forming a base package body on the base package substrate, the middle structures, the ISM coupling side, the stacking module body, and the non-inverted internal stacking module, the base package body having a top surface coplanar with the top surface of the stacking module body and a top stacking surface of the stacking structures.

7. The method as claimed in claim 6 further comprising coupling a base integrated circuit die on the base package substrate surrounded by the middle structures including applying an adhesive between the base integrated circuit die and the base package substrate.

8. The method as claimed in claim 6 wherein fabricating the internal stacking module substrate includes forming an opening in the internal stacking module substrate; and further comprising:

mounting a second base integrated circuit die over the base integrated circuit die wherein the second base integrated circuit die protrudes into the opening in the internal stacking module substrate.

9. The method as claimed in claim 6 further comprising coupling a stacked integrated circuit package on the stacking structures including coupling a multi-chip integrated circuit package, an integrated circuit carrier, or a Quad Flatpack No lead package.

10. The method as claimed in claim 6 further comprising coupling a second internal stacking module integrated circuit over the internal stacking module integrated circuit including forming a protruding region in the center of the top surface.

11. An integrated circuit package system comprising:

a non-inverted internal stacking module including:

an internal stacking module (ISM) substrate having an ISM component side and an ISM coupling side, an internal stacking module integrated circuit coupled to the ISM component side, stacking structures, adjacent to the internal stacking module integrated circuit, coupled on the ISM component side, and a stacking module body having a top surface that is coplanar with and exposes the stacking structures;

a base package substrate under the non-inverted internal stacking module;

middle structures coupled between the base package substrate and the ISM coupling side; and a base package body on the base package substrate, the middle structures, the ISM coupling side, the stacking module body, and the non-inverted internal stacking module, the base package body having a top surface coplanar with the top surface of the stacking module body and a top stacking surface of the stacking structures.

12. The system as claimed in claim 11 further comprising a base integrated circuit die on the base package substrate surrounded by the middle structures.

13. The system as claimed in claim 11 wherein the internal stacking module substrate includes an opening formed in the internal stacking module substrate.

14. The system as claimed in claim 11 further comprising a stacked integrated circuit package on the stacking structures.

15. The system as claimed in claim 11 further comprising a second internal stacking module integrated circuit over the internal stacking module integrated circuit.

16. The system as claimed in claim 11 further comprising:

connection pads on the ISM component side and coupling pads on the ISM coupling side of the internal stacking module substrate;

electrical interconnects coupled between the internal stacking module integrated circuit and the connection pads; and conductive columns, conductive pillars, or conductive balls coupled between the base package substrate and the internal stacking module substrate.

17. The system as claimed in claim 16 further comprising a base integrated circuit die on the base package substrate surrounded by the middle structures includes an adhesive between the base integrated circuit die and the base package substrate.

18. The system as claimed in claim 16 wherein the internal stacking module substrate includes an opening formed in the internal stacking module substrate; and
   further comprising:
   a second base integrated circuit die over the base integrated circuit die wherein the second base integrated circuit die protrudes into the opening in the internal stacking module substrate.

19. The system as claimed in claim 16 further comprising a stacked integrated circuit package on the stacking structures includes a multi-chip integrated circuit package, an integrated circuit carrier, or a Quad Flatpack No lead package.

20. The system as claimed in claim 16 further comprising a second internal stacking module integrated circuit over the internal stacking module integrated circuit includes a protruding region in the center surrounded by the top surface.

* * * * *